(12) United States Patent
Guha et al.

(10) Patent No.: US 9,127,859 B2
(45) Date of Patent: Sep. 8, 2015

(54) MULTI-POINT COOLING SYSTEM FOR A SOLAR CONCENTRATOR

(75) Inventors: Supratik Guha, Yorktown Heights, NY (US); Yves C. Martin, Yorktown Heights, NY (US); Robert L. Sandstrom, Yorktown Heights, NY (US); Theodore G. van Kessel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1104 days.

(21) Appl. No.: 12/686,675

(22) Filed: Jan. 13, 2010

(65) Prior Publication Data
US 2011/0168167 A1 Jul. 14, 2011

(51) Int. Cl.
*F24J 2/08* (2006.01)
*F28D 15/02* (2006.01)
*F28D 15/04* (2006.01)
(Continued)

(52) U.S. Cl.
CPC .............. *F24J 2/085* (2013.01); *F28D 15/0233* (2013.01); *F28D 15/046* (2013.01); *H01L 31/052* (2013.01); *H01L 31/0521* (2013.01); *H01L 31/0543* (2014.12); *F24J 2002/5275* (2013.01); *Y02E 10/43* (2013.01); *Y02E 10/52* (2013.01)

(58) Field of Classification Search
CPC ......... Y02E 10/52; Y02E 10/43; Y02E 10/44; F28D 15/0266; F28D 15/0233; F28D 15/046; F28D 15/0275; F24J 2/085; F24J 2002/5275; H01L 31/0521; H01L 31/0524; H01L 31/052; H01L 31/0543
USPC .............. 126/698, 600, 684; 165/104.21, 173, 165/185, 80.4, 104.33, 80.3, 80.5, 287, 165/104.31, 104.14, 104.26; 136/246, 259, 136/248
See application file for complete search history.

(56) References Cited

U.S. PATENT DOCUMENTS

| | | |
|---|---|---|
| 2,604,601 A | 7/1952 | Menzel |
| 3,070,699 A | 12/1962 | Lehmann et al. |

(Continued)

FOREIGN PATENT DOCUMENTS

| | | |
|---|---|---|
| CN | 101388420 A | 3/2009 |
| DE | 2749992 A1 | 5/1979 |

(Continued)

OTHER PUBLICATIONS

International Preliminary Report on Patentability for PCT Application No. PCT/US2011/020654, dated Jul. 26, 2012, pp. 1-7.
Chia-Yen Lee et al., "Sun Tracking Systems: A Review," Sensors 2009, 9, 3875-3890.
International Search Report; International Application No. PCT/US2011/020654; International Filing Date: Jan. 10, 2011; Date of Mailing: Mar. 9, 2011.
(Continued)

*Primary Examiner* — Kenneth Rinehart
*Assistant Examiner* — Bao D Nguyen
(74) *Attorney, Agent, or Firm* — Cantor Colburn LLP; Vazken Alexanian

(57) ABSTRACT

A solar concentrator includes an optical member having a focal point. The optical member is configured and disposed to direct incident solar radiation to the focal point. A support member is positioned adjacent to the focal point of the optical member. A solar energy collector is supported upon the support member. The solar energy collector is positioned at the focal point of the optical member. A base member is positioned in a spaced relationship from the support member. The base member and the support member define a chamber section that is in a heat exchange relationship with the solar energy collector. The chamber section is configured to absorb and dissipate heat from the solar energy collectors.

9 Claims, 2 Drawing Sheets

(51) Int. Cl.
*H01L 31/052* (2014.01)
*H01L 31/054* (2014.01)
*F24J 2/52* (2006.01)

(56) References Cited

U.S. PATENT DOCUMENTS

| | | | |
|---|---|---|---|
| 3,293,440 A | 12/1966 | Mueller | |
| 3,370,293 A | 2/1968 | Green | |
| 3,866,285 A | 2/1975 | Clark | |
| 3,984,685 A | 10/1976 | Fletcher et al. | |
| 3,984,686 A | 10/1976 | Fletcher et al. | |
| 4,027,651 A | 6/1977 | Robbins, Jr. | |
| 4,045,246 A | 8/1977 | Mlavsky et al. | |
| 4,081,289 A | 3/1978 | Campbell, III | |
| 4,086,485 A | 4/1978 | Kaplow et al. | |
| 4,107,521 A | 8/1978 | Winders | |
| 4,146,785 A | 3/1979 | Neale | |
| 4,200,472 A | 4/1980 | Chappell et al. | |
| 4,223,214 A | 9/1980 | Dorian et al. | |
| 4,225,781 A | 9/1980 | Hammons | |
| 4,262,195 A | 4/1981 | White et al. | |
| 4,278,829 A | 7/1981 | Powell | |
| 4,320,246 A * | 3/1982 | Russell | 136/248 |
| RE30,961 E | 6/1982 | Robbins | |
| 4,432,343 A | 2/1984 | Riise et al. | |
| 4,586,488 A | 5/1986 | Noto | |
| 4,592,129 A | 6/1986 | Legge | |
| 4,687,923 A | 8/1987 | Bauck | |
| 4,691,075 A | 9/1987 | Murphy | |
| 4,730,602 A | 3/1988 | Posnansky et al. | |
| 4,794,909 A | 1/1989 | Eiden | |
| 4,868,379 A | 9/1989 | West | |
| 4,909,316 A * | 3/1990 | Kamei et al. | 165/104.26 |
| 5,153,778 A | 10/1992 | Sasian-Alvarado | |
| 5,483,060 A | 1/1996 | Sugiura et al. | |
| 5,498,297 A | 3/1996 | O'Neill et al. | |
| 5,593,544 A | 1/1997 | Fahlgren et al. | |
| 5,593,549 A | 1/1997 | Stirbl et al. | |
| 6,018,122 A | 1/2000 | Hibino et al. | |
| 6,034,319 A | 3/2000 | Falbel | |
| 6,127,620 A | 10/2000 | Tange et al. | |
| 6,337,129 B1 | 1/2002 | Watanabe et al. | |
| 6,399,874 B1 * | 6/2002 | Olah | 136/259 |
| 6,465,725 B1 | 10/2002 | Shibata et al. | |
| 6,583,349 B2 | 6/2003 | Tanaka | |
| 6,617,506 B2 | 9/2003 | Sasaki | |
| 6,686,533 B2 | 2/2004 | Baum et al. | |
| 6,689,949 B2 | 2/2004 | Ortabasi | |
| 6,696,637 B2 | 2/2004 | Lawheed | |
| 6,897,423 B2 | 5/2005 | Redler et al. | |
| 6,901,994 B1 * | 6/2005 | Jin-Cherng et al. | 165/104.26 |
| 6,992,276 B2 | 1/2006 | Blauvelt et al. | |
| 7,100,680 B2 | 9/2006 | Dussinger et al. | |
| 7,109,461 B2 | 9/2006 | Lasich | |
| 7,148,465 B2 | 12/2006 | Blauvelt et al. | |
| 7,177,140 B2 | 2/2007 | Clarke et al. | |
| 7,202,457 B2 | 4/2007 | Janus et al. | |
| 7,208,674 B2 | 4/2007 | Aylaian | |
| 7,476,832 B2 | 1/2009 | Vendig et al. | |
| 7,579,551 B2 | 8/2009 | Van Marion et al. | |
| 7,709,730 B2 | 5/2010 | Johnson et al. | |
| 7,732,918 B2 * | 6/2010 | Dangelo et al. | 257/722 |
| 7,847,228 B2 | 12/2010 | Lin | |
| 8,119,962 B2 | 2/2012 | Lam | |
| 8,129,668 B2 | 3/2012 | Chang et al. | |
| 8,153,944 B2 | 4/2012 | Hines et al. | |
| 8,178,775 B2 | 5/2012 | Taylor, II et al. | |
| 8,188,413 B2 | 5/2012 | Kats et al. | |
| 8,188,414 B2 | 5/2012 | Linke | |
| 8,188,415 B2 | 5/2012 | Kats et al. | |
| 2001/0006066 A1 | 7/2001 | Cherney et al. | |
| 2004/0011395 A1 | 1/2004 | Nicoletti et al. | |
| 2004/0216777 A1 | 11/2004 | Pan | |
| 2004/0231660 A1 | 11/2004 | Nakamura | |
| 2005/0103378 A1 | 5/2005 | Pu et al. | |
| 2005/0161581 A1 | 7/2005 | Michiyama et al. | |
| 2006/0041345 A1 | 2/2006 | Metcalf | |
| 2006/0090747 A1 | 5/2006 | Harrington | |
| 2006/0225778 A1 | 10/2006 | Brabec et al. | |
| 2006/0243319 A1 | 11/2006 | Kusek et al. | |
| 2007/0033828 A1 | 2/2007 | Hartkop et al. | |
| 2007/0051360 A1 | 3/2007 | Rhee | |
| 2007/0144574 A1 | 6/2007 | Yada | |
| 2007/0215199 A1 | 9/2007 | Dold et al. | |
| 2007/0272295 A1 * | 11/2007 | Rubin et al. | 136/246 |
| 2008/0017784 A1 | 1/2008 | Hoot et al. | |
| 2008/0087274 A1 | 4/2008 | Chen | |
| 2008/0110594 A1 * | 5/2008 | Martin et al. | 165/80.4 |
| 2008/0128586 A1 | 6/2008 | Johnson et al. | |
| 2008/0138634 A1 | 6/2008 | Morris et al. | |
| 2008/0164135 A1 | 7/2008 | Slook | |
| 2008/0172256 A1 | 7/2008 | Yekutiely | |
| 2008/0245930 A1 | 10/2008 | Nayfeh et al. | |
| 2008/0276929 A1 | 11/2008 | Gerwing et al. | |
| 2008/0283121 A1 | 11/2008 | Guerra | |
| 2008/0308152 A1 | 12/2008 | Grip | |
| 2008/0314438 A1 | 12/2008 | Tran et al. | |
| 2009/0043253 A1 | 2/2009 | Podaima | |
| 2009/0056790 A1 | 3/2009 | Tian et al. | |
| 2009/0084435 A1 | 4/2009 | Guha et al. | |
| 2009/0095342 A1 | 4/2009 | Lin et al. | |
| 2009/0188488 A1 | 7/2009 | Kraft et al. | |
| 2009/0199846 A1 | 8/2009 | Collins et al. | |
| 2009/0229794 A1 | 9/2009 | Schon | |
| 2009/0288656 A1 | 11/2009 | Lin | |
| 2009/0308377 A1 | 12/2009 | Kleinwaechter | |
| 2010/0000518 A1 | 1/2010 | Chen et al. | |
| 2010/0023138 A1 | 1/2010 | McDonald et al. | |
| 2010/0031991 A1 * | 2/2010 | Mochizuki et al. | 136/206 |
| 2010/0095955 A1 | 4/2010 | Carrasco Martinez | |
| 2010/0101560 A1 | 4/2010 | Olsson et al. | |
| 2010/0180886 A1 | 7/2010 | Chang | |
| 2010/0192940 A1 | 8/2010 | Yoon | |
| 2010/0218758 A1 | 9/2010 | Guha et al. | |
| 2010/0326427 A1 | 12/2010 | Chen | |
| 2011/0139145 A1 | 6/2011 | Mackamul | |
| 2013/0233305 A1 | 9/2013 | Guha et al. | |

FOREIGN PATENT DOCUMENTS

| | | |
|---|---|---|
| DE | 4116894 A1 | 11/1992 |
| DE | 19801213 A1 | 7/1999 |
| EP | 0405678 A1 | 1/1991 |
| EP | 2105683 A | 9/2009 |
| JP | 58018059 A | 2/1983 |
| JP | 5846684 A | 3/1983 |
| JP | 6176848 A | 4/1986 |
| JP | 62206612 A | 9/1987 |
| JP | 6479609 A | 3/1989 |
| JP | 1270607 A | 10/1989 |
| JP | 2291912 A | 12/1990 |
| JP | 3-256580 A | 11/1991 |
| JP | 5052702 A | 3/1993 |
| JP | 7334767 A | 12/1995 |
| JP | 87619 A | 1/1996 |
| JP | 8095641 A | 4/1996 |
| JP | 8122420 A | 5/1996 |
| JP | 8321630 A | 12/1996 |
| JP | 11125765 A | 5/1999 |
| JP | 2003322418 A | 11/2003 |
| JP | 200664203 A | 3/2006 |
| JP | 2008124381 A | 5/2008 |
| WO | 2008034423 A2 | 3/2008 |

OTHER PUBLICATIONS

International Search Report—Written Opinion; International Application No. PCT/US2011/020654; International Filing Date: Jan. 10, 2011; Date of Mailing: Mar. 9, 2011.
International Search Report and Written Opinion for PCT Application No. PCT/US2011/020654, dated Mar. 9, 2011, pp. 1-10.
Merriam Webster's Collegiate Dictionary, 10th Edition, 1997, p. 451.

* cited by examiner

MULTI-POINT COOLING SYSTEM FOR A SOLAR CONCENTRATOR

BACKGROUND

The present invention relates to solar concentrators, and more specifically, to a multi-point cooling system for a solar concentrator.

Solar power systems fall generally into two categories: fixed position flat panel systems, and tracking concentrator systems. Fixed position flat panel systems employ one or more stationary panels that are arranged in an area having an unobstructed view of the sun. As the earth rotates, the sun's rays move over the stationary panel(s) with varying degrees of intensity depending upon geographic location, time of day and time of the year. In contrast, solar concentrator systems collect, and focus the sun's rays onto one or more solar cells. Certain solar concentration systems employ tracking systems that follow the sun's path in order to enhance energy collection. Simply put, fixed position flat panel systems represent a passive solar collection system, while solar concentrator systems represent a more active energy collection system.

Solar concentrator systems utilizing photovoltaic cells typically operate at or below about 500 suns concentration. Operating at higher sun concentration levels creates cooling challenges. At present, solar concentrator cooling systems are large unwieldy systems and/or possess limited cooling capacity. Thus, one major constraint that limits solar concentrator system is the ability to adequately cool the photovoltaic cells.

SUMMARY

According to one exemplary embodiment, a solar concentrator includes an optical member having a focal point. The optical member is configured and disposed to direct incident solar radiation to the focal point. A support member is positioned adjacent to the focal point of the optical member. A solar energy collector is supported upon the support member. The solar energy collector is positioned at the focal point of the optical member. A base member is positioned in a spaced relationship from the support member. The base member and the support member define a chamber section that is in a heat exchange relationship with the solar energy collector. The chamber section is configured to absorb and dissipate heat from the solar energy collectors.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
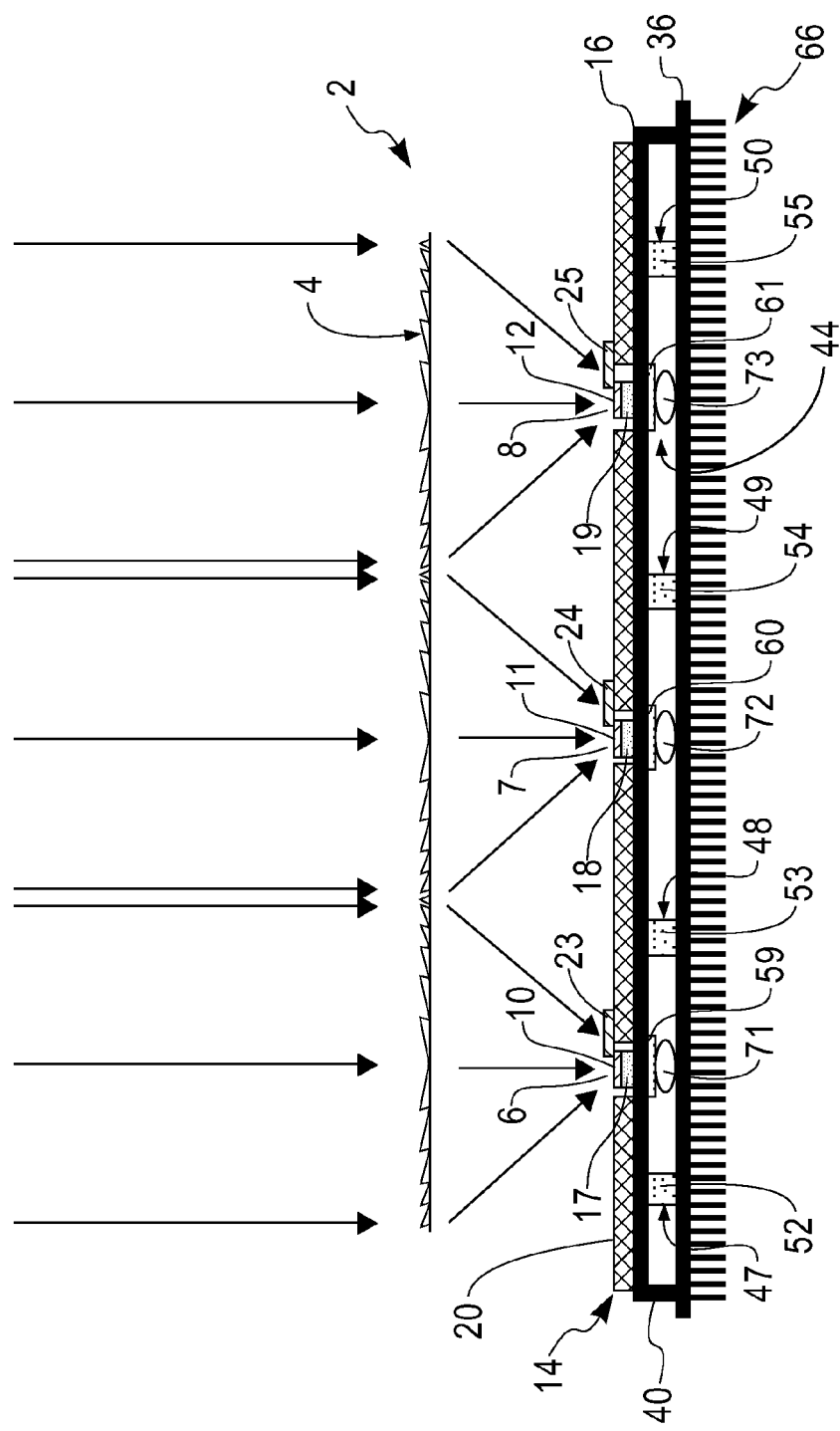
FIG. 1 is a schematic plan view of a solar concentrator including a multipoint cooling system in accordance with an exemplary embodiment.

With reference to FIG. 1, a solar concentrator constructed in accordance with an exemplary embodiment is indicated generally at 2. Solar concentrator 2 includes an optical member or lens 4 having a plurality of focal points 6-8. A plurality of solar energy collectors 10-12 are positioned at each of the respective focal points 6-8. With this arrangement, incident solar radiation passing through optical member 4 is guided to focal points 6-8 and, by extension, onto solar energy collectors 10-12. The solar energy collectors 10-12 convert the solar energy into electrical energy. As will be discussed more fully below, solar energy collectors 10-12 take the form of triple junction photovoltaic concentrator cells that operate at high solar concentrations, e.g., concentrations greater than 50 $W/cm^2$ (about 500 suns). In accordance with one aspect of the exemplary embodiment, solar energy collectors 10-12 can operate at concentrations levels as high as 200 $W/cm^2$ (about 2000 suns) or more. As such, solar concentrator 2 requires a cooling system that will absorb and dissipate heat generate at solar energy collectors 10-12 operating at such concentration levels. At this point it should be understood that while only three solar energy collectors are shown, solar concentrator 2 could include many more solar energy collectors without departing from the scope of the claims.

In accordance with an exemplary embodiment, solar energy collectors 10-12 are mounted to a multi-point cooling system 14. More specifically, solar energy collectors 10-12 are mounted to a support member 16 formed from a metal or ceramic material having a high heat dissipation co-efficient. In accordance with one aspect of an exemplary embodiment, support member 16 is formed from one or more of Aluminum Nitride (AlN), Aluminum Oxide ($Al_2O_3$), Nickel and Copper. Solar energy collectors 10-12 are mounted to support member 16 via a corresponding plurality of thermal interface members 17-19. In the exemplary embodiment shown, a layer of insulation is mounted to support member 16 about solar energy collectors 10-12. Electrical connections 23-25 extend from respective ones of solar energy collectors 10-12 along insulation layer 20. Electrical connections 23-25 lead to an energy storage device (not shown).

In further accordance with the exemplary embodiment, multi-point cooling system 14 includes a base member 36. Support member 16 is mounted to a base member 36 via a peripheral wall 40. In a manner similar to that described above, base member 36 is formed from a metal or ceramic material having a high heat diffusion co-efficient. Base member 36 is spaced from support member 16 so as to define a chamber section 44. In accordance with one aspect of the invention, chamber section 44 is filled with a vapor formed from, for example, water or ammonia, that enhances heat dissipation from solar energy collectors 10-12. Base member 36 is also coupled to support member 16 via a plurality of structural supports 47-50. Each structural support 47-50 is covered by a wicking material 52-55. In accordance with one aspect of an exemplary embodiment, wicking material 52-55 is formed from sintered copper particles or from a material having machined grooves. Wicking material 52-55 enhances heat transferred from solar energy connector 10-12 into chamber section 44. In order to further enhance heat transfer, a plurality of nucleation membranes 59-61 is mounted to support member 16 within chamber section 44. Each nucleation membrane 59-61 is positioned adjacent a corresponding one of solar energy collectors 10-12. In accordance with an aspect of an exemplary embodiment, nucleation membranes 59-61 are formed from sintered copper particles arranged in a body formed from copper or aluminum. With this arrangement, vapor travels in wicking material 52-55 and or nucleation membranes 59-61. Heat from the vapor is dissipated through, for example, base member 36 forming a condensate that returns to chamber section 44.

In order to facilitate heat energy transfer from chamber section 44, solar concentrator 2 includes a plurality of cooling fins 66 mounted to base member 36. Cooling fins 66 transfer heat energy from chamber section 44 to be dissipated via air currents passing across base member 36. In accordance with one aspect of the invention, heat energy dissipation is further enhanced by a plurality of conduits 71-74 extending through chamber section 44. Conduits 71-74 are configured and disposed to absorb heat energy from chamber section 44. In accordance with one aspect of the invention of the present embodiment, conduits 71-74 are filled with a liquid that is circulated within chamber section 44. The liquid absorbs heat energy that is passed to, for example, a cooling medium after which the liquid is re-circulated back to chamber section 44.

Figure 2:
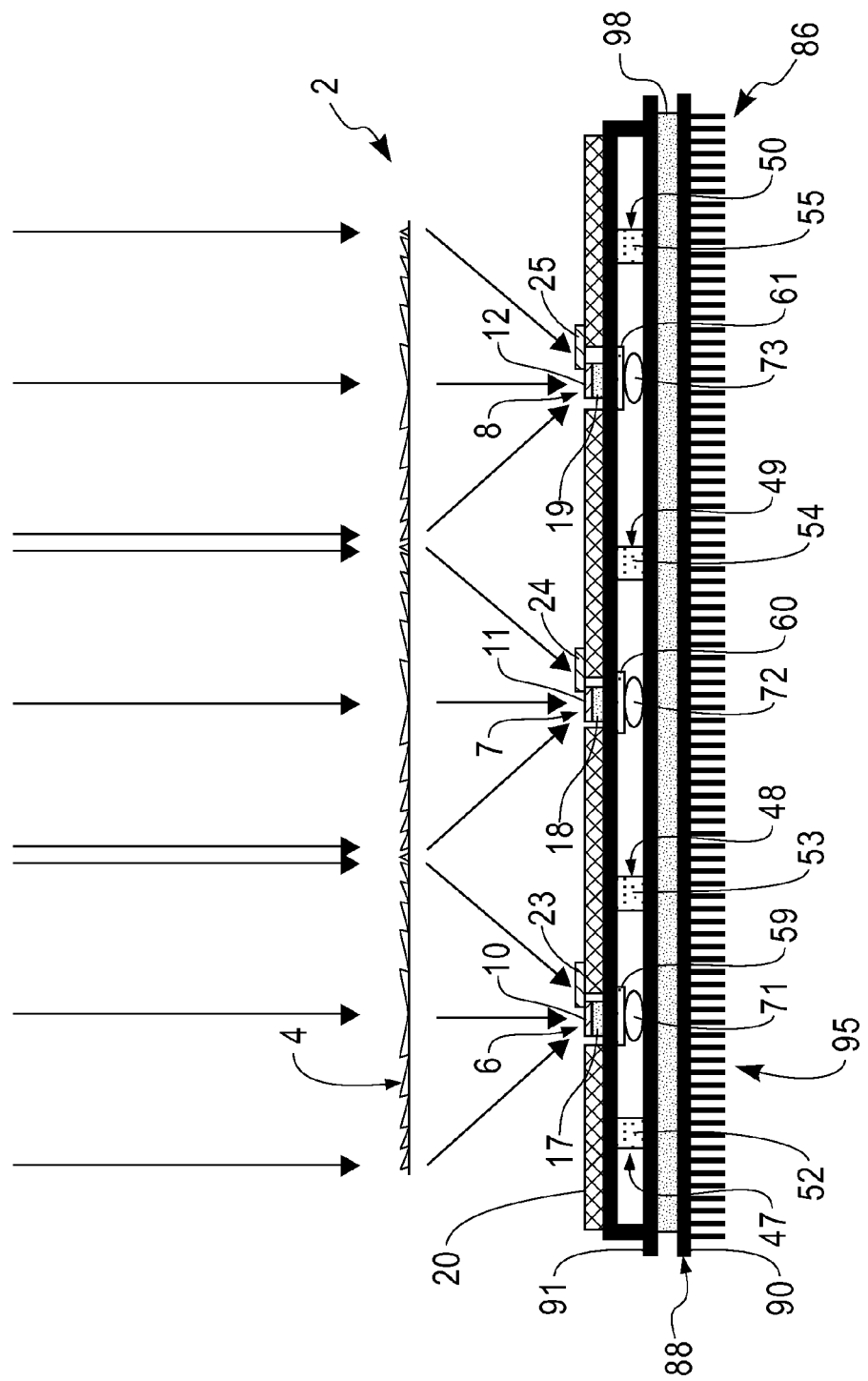
FIG. 2 is a schematic plan view of a solar concentrator including a multipoint cooling system in accordance with another aspect of the exemplary embodiment.

Reference will now be made to FIG. 2, wherein like reference numbers represent corresponding parts in the respective use, in describing another aspect of the exemplary embodiment. In accordance with the embodiment shown, solar concentrator 2 includes a finned cold plate 86 mounted to base member 36. More specifically, finned cold plate 86 includes a body 88 having a first substantially planar surface 90 and an opposing, second substantially planar surface 91. First substantially planar surface 90 is provided with a plurality of cooling fins 95 that dissipate heat energy in a manner similar to that described above. Second substantially planar surface 91 is attached to base member 36 via a thermal interface member 98. Thermal interface member 98 enhances energy transfer from base member 36 to finned cold plate 86. In accordance with an aspect of an exemplary embodiment, cold plate 86 is formed from one of copper, aluminum or a high heat dissipation coefficient ceramic material.

At this point, it should be understood that the exemplary embodiments provide a system for removing heat energy from a solar concentrator. That is, the present exemplary embodiments enable a solar concentrator to operate above 2000 suns while remaining cool. That is, in contrast to existing systems that must operate substantially below 2000 suns, the exemplary embodiments provide sufficient cooling to enable so the solar concentrator to operate at much higher solar concentration levels in order to enhance energy conversion.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A solar concentrator comprising:
   an optical member having a focal point, the optical member being configured and disposed to direct incident solar radiation to the focal point;
   a support member positioned adjacent the focal point of the optical member;
   a solar energy collector supported upon the support member, the solar energy collector being positioned at the focal point of the optical member;
   a base member positioned in a spaced relationship from the support member, the base member and the support member defining a chamber section that is in a heat exchange relationship with the solar energy collectors, the chamber section being configured to absorb and dissipate heat from the solar energy collectors;
   a plurality of conduits extending through the chamber section and directly contacting a surface of the base member in the chamber section, the plurality of conduits absorbing heat from the chamber section received from the solar energy collectors wherein the plurality of conduits transport a heat exchange medium through the chamber section in a heat exchange relationship with a working fluid in the chamber section; and
   one or more nucleation membranes arranged between and directly contacting one or more of the plurality of conduits and a surface of the support member in the chamber section, the plurality of conduits being in a heat exchange relationship with the surface of the support member solely through a corresponding one of the one or more nucleation membranes.

2. The solar concentrator according to claim 1, further comprising: a thermal interface member positioned between the solar energy collector and the support member.

3. The solar concentrator according to claim 1, wherein the chamber section comprises a vapor chamber.

4. The solar concentrator according to claim 3, further comprising: a support element extending between the support member and the base member within the chamber section.

5. The solar concentrator according to claim 4, wherein the support element is formed from a wicking material, the support element enhancing thermal energy transfer between the solar energy collector and the chamber section.

6. The solar concentrator according to claim 1, further comprising: a plurality of heat dissipating fins mounted to an external surface of the base member.

7. The solar concentrator according to claim 1, wherein the heat exchange medium is a liquid.

8. The solar concentrator according to claim 1, further comprising: a finned cold plate mounted to the base member.

9. The solar concentrator according to claim 8, further comprising: a thermal interface material positioned between the finned cold plate and the base member.

* * * * *